US010521522B2

(12) United States Patent
Kuwahara

(10) Patent No.: US 10,521,522 B2
(45) Date of Patent: Dec. 31, 2019

(54) ROBOT SIMULATOR AND FILE GENERATION METHOD FOR ROBOT SIMULATOR

(71) Applicant: KABUSHIKI KAISHA YASKAWA DENKI, Kitakyushu-shi (JP)

(72) Inventor: Koichi Kuwahara, Fukuoka (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 642 days.

(21) Appl. No.: 14/591,000

(22) Filed: Jan. 7, 2015

(65) Prior Publication Data

US 2015/0379171 A1 Dec. 31, 2015

(30) Foreign Application Priority Data

Jun. 30, 2014 (JP) .................................. 2014-135205

(51) Int. Cl.
*G06F 17/50* (2006.01)
(52) U.S. Cl.
CPC .................................. *G06F 17/5009* (2013.01)
(58) Field of Classification Search
None
See application file for complete search history.

(56) References Cited

U.S. PATENT DOCUMENTS 4,360,886 A * 11/1982 Kostas ...................... B25J 3/04
318/568.14

5,005,119 A * 4/1991 Rumbaugh ......... G06F 3/04817
718/101

(Continued)

FOREIGN PATENT DOCUMENTS

JP 10-180664 7/1998
JP 2003-150220 5/2003

(Continued)

OTHER PUBLICATIONS

Adobe Using Adobe Acrobat 9 Pro Extended Sep. 20, 2011.*

(Continued)

*Primary Examiner* — Rehana Perveen
*Assistant Examiner* — Cuong V Luu
(74) *Attorney, Agent, or Firm* — Mori & Ward, LLP

(57) ABSTRACT

A robot simulator according to one aspect of the embodiment includes a job information acquiring unit, an image generating unit, a playback information generating unit, and an output unit. The job information acquiring unit acquires job information that includes a group of operation commands for a robot and information for a plurality of target points through which the robot passes. The image generating unit generates virtual three-dimensional images of a robot system including the robot in a three-dimensional space for each of the operation commands. The playback information generating unit generates playback information for continuously replaying the three-dimensional images by animation in association with the job information. The output unit generates and outputs an output file in which the job information, the three-dimensional images, and the playback information are embedded in an electronic document format that can be browsed in a general-purpose manner.

16 Claims, 15 Drawing Sheets

(56) References Cited

U.S. PATENT DOCUMENTS

| | | | | |
|---|---|---|---|---|
| 5,046,022 | A | * | 9/1991 | Conway ................ B25J 9/1689 700/250 |
| 5,511,147 | A | * | 4/1996 | Abdel-Malek ......... B25J 9/1671 700/264 |
| 5,657,480 | A | * | 8/1997 | Jacobson ............ G06F 9/45512 713/500 |
| 5,940,296 | A | * | 8/1999 | Meyer ....................... G06T 1/20 700/83 |
| 6,167,328 | A | * | 12/2000 | Takaoka ................ B25J 9/1671 318/568.1 |
| 6,298,474 | B1 | * | 10/2001 | Blowers .................... G06F 8/34 700/83 |
| 6,463,358 | B1 | * | 10/2002 | Watanabe .............. B25J 9/1674 318/14 |
| 6,944,584 | B1 | * | 9/2005 | Tenney .................. B25J 9/1671 700/17 |
| 7,627,821 | B2 | * | 12/2009 | Klementiev ........ G06F 9/45512 715/704 |
| 7,979,254 | B2 | * | 7/2011 | Ohashi ............... G05B 19/4069 700/189 |
| 9,056,396 | B1 | * | 6/2015 | Linnell ................ G05B 19/427 |
| 9,278,449 | B1 | * | 3/2016 | Linnell .................... B25J 9/163 |
| 9,701,018 | B2 | * | 7/2017 | Linnell .................. B25J 9/1664 |
| 2003/0023637 | A1 | * | 1/2003 | Halahmi ................ G07F 15/00 715/249 |
| 2003/0074170 | A1 | * | 4/2003 | Watanabe .............. B25J 9/1671 703/6 |
| 2003/0090491 | A1 | * | 5/2003 | Watanabe .............. B25J 9/1671 345/473 |
| 2004/0073404 | A1 | * | 4/2004 | Brooks ................ G05B 19/409 702/183 |
| 2004/0199288 | A1 | * | 10/2004 | Watanabe .............. B25J 9/1671 700/245 |
| 2006/0088203 | A1 | * | 4/2006 | Boca ........................ G06K 9/32 382/153 |
| 2006/0184275 | A1 | * | 8/2006 | Hosokawa ............. B25J 9/1666 700/245 |
| 2011/0231384 | A1 | * | 9/2011 | Koroteyev ........ G06F 17/30734 707/709 |
| 2012/0069131 | A1 | * | 3/2012 | Abelow ............... G06Q 10/067 348/14.01 |
| 2012/0086718 | A1 | | 4/2012 | Schreiber |
| 2012/0249741 | A1 | * | 10/2012 | Maciocci ................ G06F 3/011 348/46 |
| 2013/0116828 | A1 | * | 5/2013 | Krause .................. B25J 9/1605 700/264 |
| 2015/0323398 | A1 | * | 11/2015 | Lauzier ................. B25J 9/0081 73/862.08 |
| 2015/0343635 | A1 | * | 12/2015 | Linnell .................. B25J 9/1671 700/249 |
| 2017/0097631 | A1 | * | 4/2017 | Linnell .................. B25J 9/1656 |
| 2017/0235800 | A1 | * | 8/2017 | Poston ............. G06F 17/30873 707/722 |

FOREIGN PATENT DOCUMENTS

| | | |
|---|---|---|
| JP | 2008-100315 | 5/2008 |
| JP | 2011-161549 | 8/2011 |
| KR | 10-0929445 B1 | 12/2005 |
| WO | WO 2010/135353 | 11/2010 |

OTHER PUBLICATIONS

Cyberbotics Ltd. Webots User Guide Release 7.2.4 Aug. 2003.*
Barbero et al. Assessment of 3D Viewers for the Display of Interactive Documents in the Learning of Graphic Engineering Educational Technology & Society, 15(4), pp. 167-180, Jun. 2011 (Year: 2011).*
Cellary et al. Chapter 2 Interactive 3D Content Standards Interactive 3D Multimedia Content, Springer-Verlag London Limited (Year: 2012).*
Hetherington et al. 3D ePortfolios: Challenges and Opportunities for the Display of Interactive Models of Building Designs 2009 Second International Conference in Visualisation, pp. 132-137 (Year: 2009).*
Vladislav Vasilyev Towards Interactive 3D Graphics in Chemistry Publications Theor Chem Acc pp. 173-176 (Year: 2010).*
Cyberbotics Ltd., "Webots User Guide release 7.0.3", Dec. 4, 2012, pp. 1-256, www.cyberbotics.com. See Cite No. 2.
Chinese Office Action for corresponding CN Application No. 201410818460.5, dated Oct. 28, 2016.
Cyberbotics Ltd., "Webots User Guide release 7.2.4", Aug. 28, 2013, pp. 1-256, XP055285317, www.cyberbotics.com, Retrieved from the Internet: URL: https://web.archive.org/web/20130906131237/ http://www.cyberbotics.com/guide.pdf on Jul. 1, 2016. See Cite No. 2.
Extended European Search Report for corresponding EP Application No. 14200583.4-1807, dated Jul. 8, 2016.
"Using Adobe Acrobat 9 Pro Extended", 2009, pp. 1-489, Adobe (See Cite No. 4).
Korean Office Action for corresponding KR Application No. 10-2015-0036001, dated Jun. 1, 2016.
Japanese Office Action for corresponding JP Application No. 2014-135205, dated Mar. 13, 2018 (w/ English machine translation).
Mitsubishi Electric, the Mitsubishi Electric industrial robot three-dimensional simulator, MELFA-Works, Aug. 2008, retrieved from the Internet Aug. 7, 2017, <http://dl.mitsubishielectric.co.jp/dl/fa/document/catalog/robot/I09020/melfaworks_I09020.pdf> (w/ English translation of pp. 2-3).
Japanese Office Action for corresponding JP Application No. 2014-135205, dated Aug. 29, 2017 (w/ English machine translation).

* cited by examiner

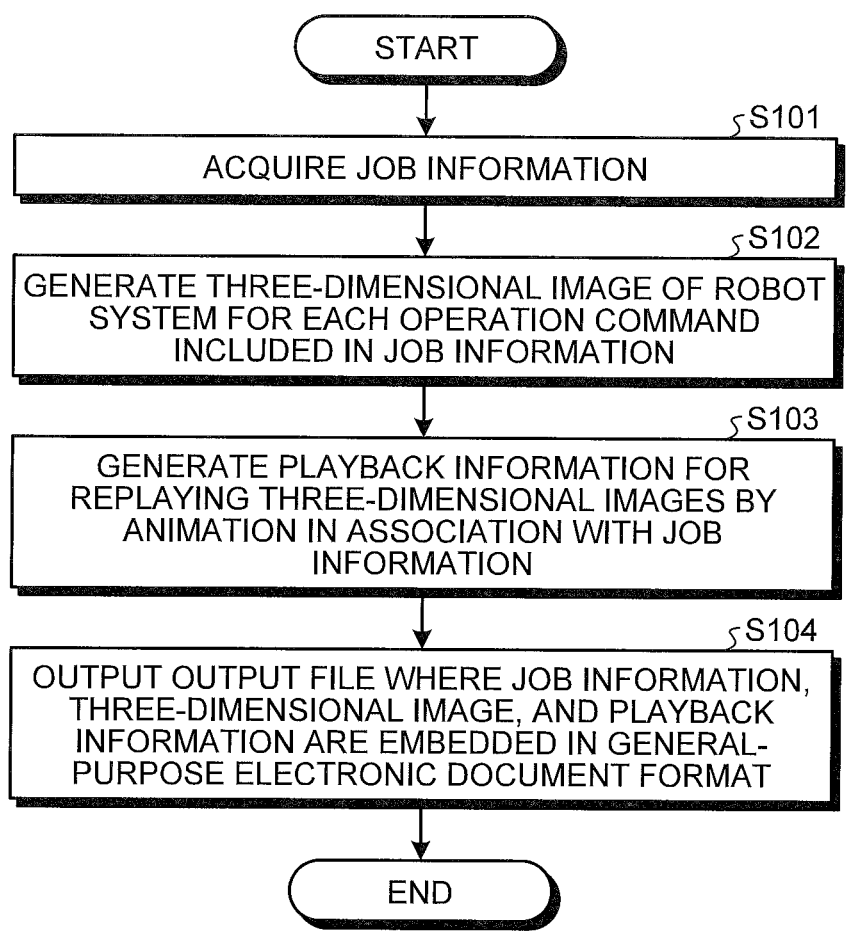

ROBOT SIMULATOR AND FILE GENERATION METHOD FOR ROBOT SIMULATOR

CROSS-REFERENCE TO RELATED APPLICATION

This application is based upon and claims the benefit of priority of the prior Japanese Patent Application No. 2014-135205, filed on Jun. 30, 2014, the entire contents of which are incorporated herein by reference.

FIELD

The embodiment discussed herein is directed to a robot simulator and a file generation method for the robot simulator.

BACKGROUND

There have been proposed conventional various robot simulators and teaching systems that graphically display three-dimensional model images for a robot system on a display apparatus based on three-dimensional computer aided design (CAD) data, etc., and operate the three-dimensional model images, to simulate and calculate the operation of the robot system.

For example, the "control simulation system" disclosed in Japanese Patent Application Laid-open No. 2008-100315 creates an animation to simulate motion of a robot and various instruments so as to replay the animation.

An operator uses such a system, and thus can verify the time required for a robot's operation and the interference of a robot with the periphery without actually actuating the robot.

However, the above-mentioned conventional technique has room for further improvement in easy confirmation and distribution of the simulation results.

Specifically, the conventional technique has required a simulator and a teaching system even for confirming the simulation results. This has limited partner apparatuses capable of confirming and receiving the created simulation results.

SUMMARY

A robot simulator according to one aspect of the embodiment includes a job information acquiring unit, an image generating unit, a playback information generating unit, and an output unit. The job information acquiring unit acquires job information that includes a group of operation commands for a robot and information for a plurality of target points through which the robot passes. The image generating unit generates virtual three-dimensional images of a robot system including the robot in a three-dimensional space for each of the operation commands. The playback information generating unit generates playback information for continuously replaying the three-dimensional images by animation in association with the job information. The output unit generates and outputs an output file in which the job information, the three-dimensional images, and the playback information are embedded in an electronic document format that is browsable in a general-purpose manner.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein:

FIG. 6 is a flowchart illustrating the process for the processing executed by the robot simulator.

DESCRIPTION OF EMBODIMENT

An embodiment of a robot simulator and a file generation method for the robot simulator disclosed in the present application will now be described with reference to the accompanying drawings. It should be noted that the embodiment below is not intended to limit the scope of the invention.

The following describes a robot simulator that outputs a graphic image for a three-dimensional model of a robot to a display unit such as a display as an example. The graphic image for such a three-dimensional model may be hereinafter referred to as a "virtual image".

Figure 1:
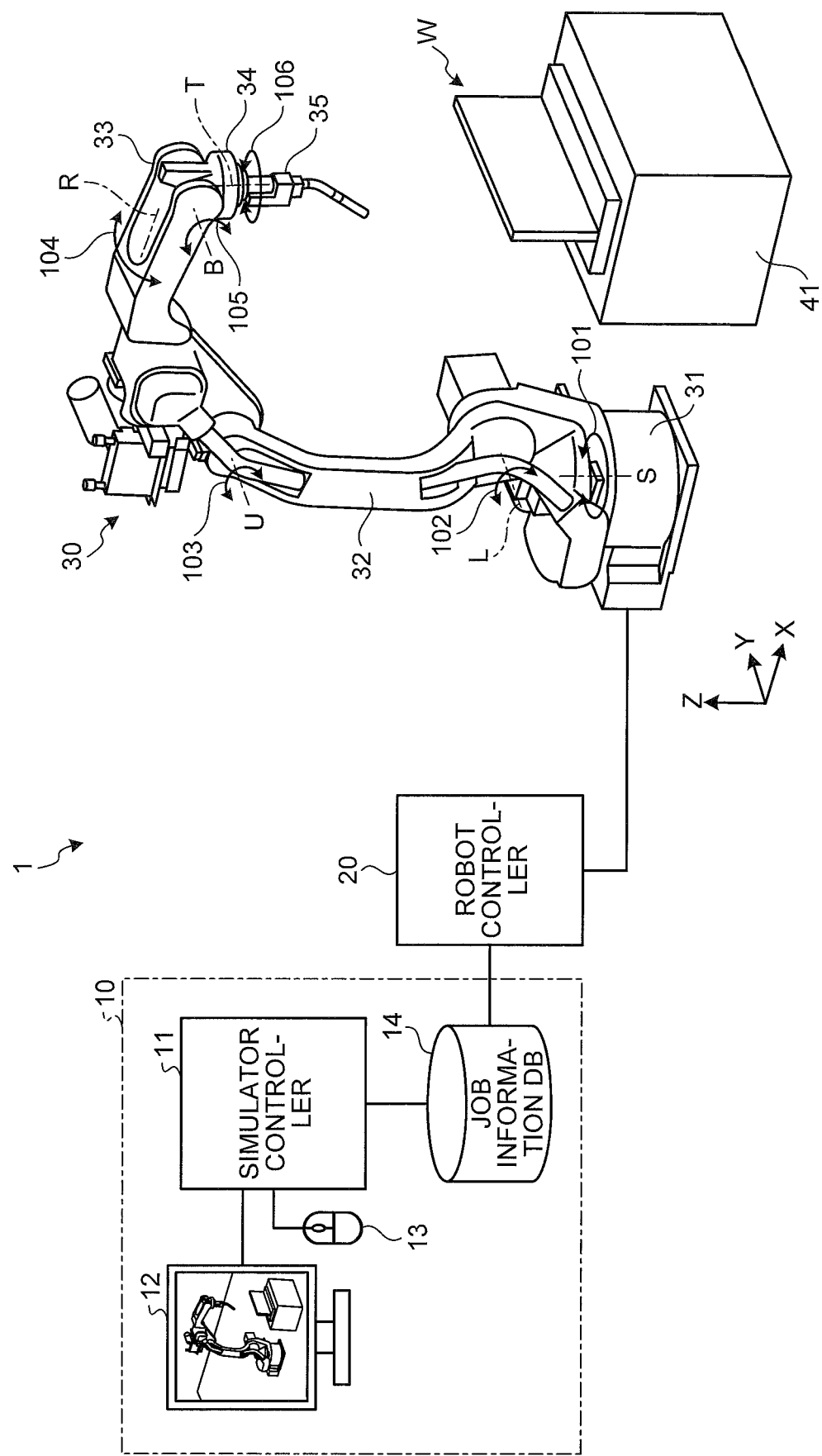
FIG. 1 is a schematic diagram illustrating the whole configuration of a robot system including a robot simulator in accordance with the embodiment.

FIG. 1 is a schematic diagram illustrating the whole configuration of a robot system 1 including a robot simulator 10 in accordance with the embodiment.

The robot system 1 includes the robot simulator 10, a robot controller 20, and a robot 30 as illustrated in FIG. 1. The robot simulator 10 includes a simulator controller 11, a display unit 12, an operation unit 13, and a job information database (DB) 14.

The simulator controller 11 is a controller for controlling the whole robot simulator 10, and includes a calculation processor and a storage apparatus. The simulator controller 11 is connected to various apparatuses forming the robot simulator 10 such as the display unit 12, the operation unit 13, and the job information DB 14 so as to transmit information to each other.

The simulator controller 11 also outputs a virtual image including the robot 30 whose operation has been simulated and calculated to the display unit 12 based on the operation of an operator through the operation unit 13.

In addition, the simulator controller 11 generates a job program, which is a group of operation commands for operating the robot 30, from the virtual image based on the operation of an operator through the operation unit 13, and registers the generated job program on the job information DB 14.

The display unit 12 is a display device such as what is called a display. The operation unit 13 is a pointing device such as a mouse. The operation unit 13 is not necessarily formed as a hardware component and, for example, may be a software component such as touch keys displayed on a touch panel display.

The job information DB 14 is a database where job information, which is the information related to teaching such as the above-mentioned job program and "teaching points" included in the job program, is registered.

The "teaching points" are information serving as target positions (target points) through which each joint or rotation mechanism of the robot must pass at the time of replaying the operation of the robot 30, and are, for example, stored as pulse values of each encoder provided to a servomotor driving each axis of the robot 30. The robot 30 operates based on the information of a plurality of teaching points, and the teaching points are, therefore, associated and stored in the job information DB 14 for each motion (job) of the robot 30.

In other words, the job program of the robot 30 includes combined information such as the teaching points, interpolation operation commands between each teaching point, and operation commands for an end effector installed on the tip part of the robot 30. The job information DB 14 stores therein information of the teaching points included in the job program of the robot 30 for each job program. For example, the robot 30 is operated based on the job program at the time of replaying the operation of the robot 30.

The job information DB 14 is connected to the robot controller 20, which is a controller for controlling the real operation of the robot 30, so as to transmit information to each other. The robot controller 20 controls various operations of the robot 30 based on the job program registered on the job information DB 14.

In FIG. 1, the job information DB 14 (robot simulator 10) and the robot controller 20 are connected to each other. If the job program generated by the robot simulator 10 is configured to be stored in a predetermined storage unit (not illustrated) in the robot controller 20, the job information DB 14 (robot simulator 10) and the robot controller 20 are not necessarily connected to each other.

For example, after the job program generated by the robot simulator 10 is copied to a medium such as a universal serial bus (USB) memory, the medium may be connected to the robot controller 20 and stored in a predetermined storage unit (not illustrated) in the robot controller 20 by a predetermined operation.

In order to make the explanation easy, FIG. 1 illustrates an example of the configuration where the job information DB 14 and the simulator controller 11 are separately formed, but the job information DB 14 may be stored in a storage unit inside the simulator controller 11.

The robot 30 includes a base unit 31, a first arm 32, a second arm 33, a wrist unit 34, and an end effector 35. The base unit 31 is fixed to a floor surface, etc., and supports the base end part of the first arm 32 so as to rotate the base end part of the first arm 32 around the axis S (see an arrow 101 in FIG. 1) and around the axis L (see an arrow 102 in FIG. 1).

The first arm 32 has its base end part supported by the base unit 31 as described above and supports the base end part of the second arm 33 at its tip part so as to rotate the base end part of the second arm 33 around the axis U (see an arrow 103 in FIG. 1).

The second arm 33 has its base end part supported by the first arm 32 as described above and supports the base end part of the wrist unit 34 at its tip part so as to rotate the base end part of the wrist unit 34 around the axis B (see an arrow 105 in FIG. 1). The second arm 33 is provided so as to be rotated around the axis R (see an arrow 104 in FIG. 1).

The wrist unit 34 has its base end part supported by the second arm 33 as described above and supports the base end part of the end effector 35 at its tip part so as to rotate the base end part of the end effector 35 around the axis T (see an arrow 106 in FIG. 1).

In this embodiment, the end effector 35 is a welding torch, and the robot 30 is a welding robot that uses the welding torch to apply welding to a workpiece W with a T-shaped cross section placed on a placement base 41.

A drive source such as a servomotor is mounted on each joint of the robot 30, and these drive sources are driven by control of the robot controller 20 based on the job program registered on the job information DB 14.

Figure 2:
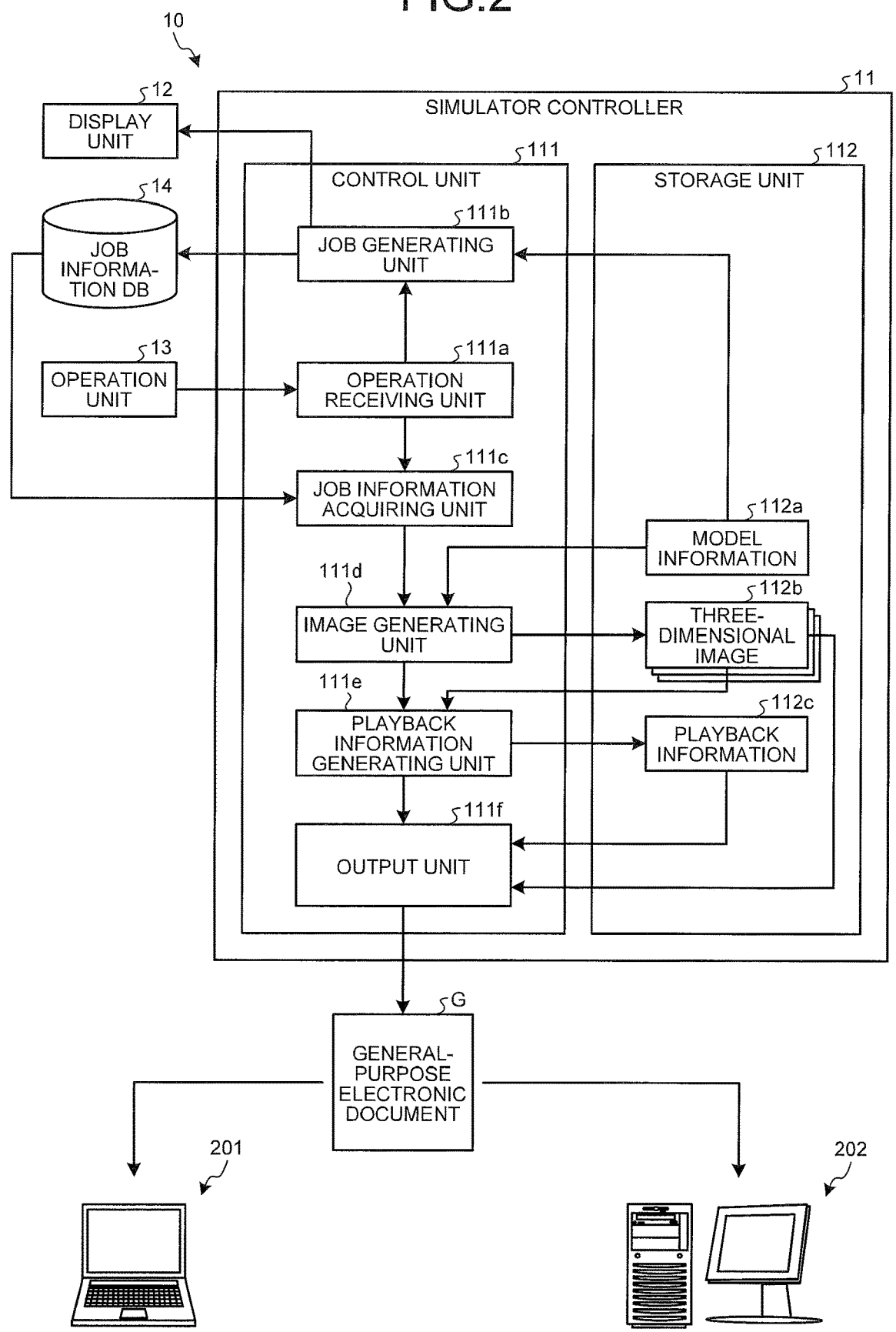
FIG. 2 is a block diagram illustrating the configuration of the robot simulator in accordance with the embodiment.

The following describes the block configuration of the robot simulator 10 in accordance with the embodiment with reference to FIG. 2. FIG. 2 is a block diagram illustrating the configuration of the robot simulator 10 in accordance with the embodiment. FIG. 2 illustrates only the components necessary for the explanation of the robot simulator 10, and omits the description about the general components.

FIG. 2 mainly illustrates the internal configuration of the simulator controller 11, and may simplify the explanation of the display unit 12, the operation unit 13, and the job information DB 14, which have been already illustrated in FIG. 1.

The simulator controller 11 includes a control unit 111 and a storage unit 112 as illustrated in FIG. 2. The control unit 111 includes an operation receiving unit 111a, a job generating unit 111b, a job information acquiring unit 111c, an image generating unit 111d, a playback information generating unit 111e, and an output unit 111f. The storage unit 112 stores therein model information 112a, three-dimensional images 112b, and playback information 112c.

The operation receiving unit 111a receives input operation input by an operator through the operation unit 13, and notifies the job generating unit 111b of the received input operation related to job generation and job editing.

Examples of the input operation related to job generation and job editing include operation for handling operation components such as a "GENERATE JOB" button and an "EDIT JOB" button displayed on the display unit 12.

The operation receiving unit 111a also notifies the job information acquiring unit 111c of the received input operation related to the output of a "general-purpose electronic document". The "general-purpose electronic document" means a file in an electronic document format that can be browsed in a general-purpose manner. Examples of the electronic document formats that can be browsed in a general-purpose manner include a portable document format (PDF) (registered trademark).

Contrary to the conventional technique, this embodiment allows the simulation results of the robot simulator 10 to be output in a "general-purpose electronic document". This enables the simulation results to be confirmed and distributed without limiting partner apparatuses.

Examples of the above-mentioned input operation related to the output of a "general-purpose electronic document" include operation for clicking an operation component such as an "OUTPUT FOR GENERAL-PURPOSE" button displayed on the display unit 12.

Figure 3:
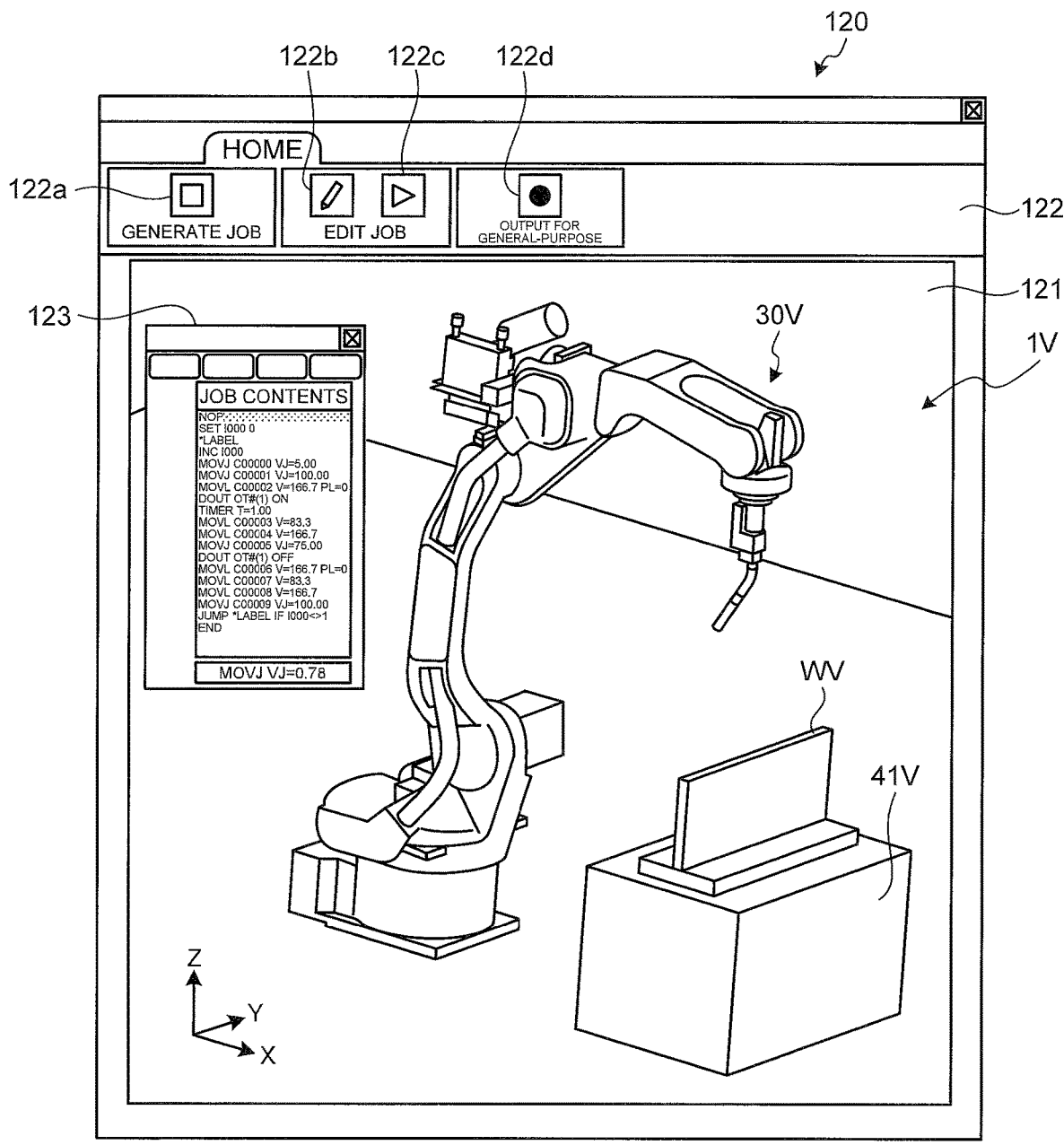
FIG. 3 is a schematic diagram illustrating an example of the displayed contents displayed on a display unit.

The following describes an example of the displayed contents displayed on the display unit 12 in the robot simulator 10 in accordance with the embodiment with reference to FIG. 3. FIG. 3 is a schematic diagram illustrating an example of the displayed contents displayed on the display unit 12.

In the following illustration, the names and reference numerals of various apparatuses rendered as a virtual image are followed by a letter "V". For example, when rendered as a virtual image, the robot 30 is illustrated as a "robot 30V".

As illustrated in FIG. 3, a virtual image of a robot system 1V including the robot 30V, a placement base 41V, and a workpiece WV is displayed on a display window 120, which is one of the display areas in the display unit 12.

Specifically, a virtual image is displayed on a virtual image area 121 in the display window 120. The display window 120 includes graphical user interface (GUI) widgets including various buttons 122a to 122d displayed on a ribbon 122 and a dialogue box 123.

For example, the button 122a corresponds to the above-mentioned "GENERATE JOB" button. The buttons 122b and 122c correspond to the above-mentioned "EDIT JOB" button. For example, the button 122d corresponds to the above-mentioned "OUTPUT FOR GENERAL-PURPOSE" button.

An orthogonal coordinate system is displayed in the lower left of the virtual image area 121. This is a reference coordinate system in a virtual image, corresponds to a three-dimensional coordinate system, and serves as the reference in the horizontal direction and the vertical direction. Specifically, a direction parallel to the XY plane specified by the X axis and Y axis of the reference coordinate system is defined as the horizontal direction, and a direction parallel to the Z axis of the reference coordinate system is defined as the vertical direction.

An operator operates such GUI widgets and operable components on a virtual image (for example, each part of the robot 30V) so as to instruct the robot simulator 10 to operate.

The robot simulator 10 can drive each joint of the robot 30V, change a viewpoint to display a virtual image seen from a certain direction, and enlarge/reduce the display based on the operation instructed by the operator.

Each joint position of the robot 30 where the tip of the end effector 35 (the tip of the welding torch in this embodiment) may reach a specific point in a virtual image is obtained using the inverse kinematics computation so as to generate and display the robot 30V where the tip of the end effector 35 has reached the specific point.

Examples of the processes for generating a job by the robot simulator 10 include a process where an operator clicks a "GENERATE JOB" button, a dialogue box (not illustrated) urging the operator to input conditions necessary for generating a job is displayed on the display unit 12, and then a job program is automatically generated and registered on the job information DB 14 depending on the conditions input by the operator.

Besides, whenever a predetermined operation of an operator causes the axes of the robot 30V to be separately operated and causes the robot 30V to take a desirable position, its state may be registered on the job information DB 14 as a teaching point.

Furthermore, the operation instructed by an operator (for example, clicking an "EDIT JOB" button) enables the teaching points and the job programs registered on the job information DB 14 to be read out, enables the robot 30V having reached a specific teaching point to be displayed, enables a series of operations of the robot 30 due to a job program to be reproduced on the display unit 12, and enables the contents of the job program to be changed. The contents of the job program can be displayed as "JOB CONTENTS" in the dialogue box 123, for example, as illustrated in FIG. 3.

These functions in the off-line teaching system of a robot are well known, and thus, detailed description other than the portion in accordance with the embodiment is omitted.

The above-mentioned "GENERATE JOB" button and other buttons may be provided not on the ribbon 122 but on the dialogue box 123, for example.

Referring back to the explanation of FIG. 2, the job generating unit 111b will be described. When having received the input operation related to the job generation and job editing from the operation receiving unit 111a, the job generating unit 111b reflects the contents of the input operation on a virtual image displayed on the display unit 12, and generates a job program based on the contents of the input operation so as to register the generated job program on the job information DB 14.

Virtual images are rendered based on the model information 112a. The model information 112a is information that includes rendering information previously defined for each kind of the robot 30 and the workpiece W. An operator can perform input related to the output of the "general-purpose electronic document" on the generated job program. Specifically, this corresponds to the above-mentioned operation for clicking an "OUTPUT FOR GENERAL-PURPOSE" button.

When having received the input operation related to the output of the "general-purpose electronic document" from the operation receiving unit 111a, the job information acquiring unit 111c acquires job information, which is information including a job program registered on the job information DB 14. The means for acquiring job information in the scope of claims corresponds to the job information acquiring unit 111c.

The job information acquiring unit 111c also transmits the acquired job information to the image generating unit 111d. In the embodiment, the job information acquiring unit 111c acquires job information from the job information DB 14 where job programs and the like have been registered by the job generating unit 111b, but this is not limiting.

For example, job information generated by a computer or other apparatuses different from the simulator controller 11 may be acquired via a communication network, or may be acquired via media such as a USB memory.

The image generating unit 111d generates a virtual three-dimensional image of the robot system 1 including the robot 30 in the three-dimensional space based on the job information received from the job information acquiring unit 111c and the model information 112a, and stores the generated three-dimensional image as the three-dimensional images 112b in the storage unit 112.

The three-dimensional images 112b is generated at least for each job step of the job program (which corresponds to each operation command). The means for generating a virtual three-dimensional image of the robot system 1 in the scope of claims in the three-dimensional space for each operation command corresponds to the image generating unit 111d. The image generating unit 111d also transmits the job information received from the job information acquiring unit 111c to the playback information generating unit 111e.

The playback information generating unit 111e generates, based on the job information received from the image generating unit 111d and the three-dimensional images 112b, information for continuously replaying the three-dimensional images 112b by animation in association with the job information, and stores the generated information as the playback information 112c in the storage unit 112. The means for generating the playback information 112c, which is information for continuously replaying the three-dimensional images in the scope of claims by animation, corresponds to the playback information generating unit 111e.

Examples of the playback information 112c include information for associating the three-dimensional images 112b for each job step, information related to the playback order of the three-dimensional images 112b, information related to the interpolation between the three-dimensional images 112b, and information related to the playback time for each frame at the time of continuously replaying the three-dimensional images 112b by animation.

The playback information generating unit 111e can synchronize the playback time with the real operating time, which is the time when the robot 30 really operates, and then set the playback time. The playback information generating unit 111e also transmits the job information received from the image generating unit 111d to the output unit 111f.

The output unit 111f generates and outputs, based on the job information received from the playback information generating unit 111e, the three-dimensional images 112b, and the playback information 112c, a general-purpose electronic document G where these pieces of information are embedded as an output file. The means for generating and outputting an output file in the scope of claims in an electronic document format that can be browsed in a general-purpose manner corresponds to the output unit 111f.

In addition, the output unit 111f can embed additional information related to the job program and the general-purpose electronic document G at the time of generating the general-purpose electronic document G. Examples of the concrete processes include a process where an operator clicks an "OUTPUT FOR GENERAL-PURPOSE" button, a dialogue box (not illustrated) urging the operator to input additional information is displayed on the display unit 12, and then the output unit 111f embeds the additional information such as a text input by and a still image specified by the operator at the time of generating the general-purpose electronic document G.

When the general-purpose electronic document G is the above-mentioned PDF file as an example, the output unit 111f can embed the job information, the three-dimensional images 112b, and the playback information 112c using an application programming interface (API) of Java (registered trademark). In such a case, the general-purpose electronic document G includes these pieces of information as a part of the PDF file.

This enables the general-purpose electronic document G output from the output unit 111f to be browsed using apparatuses other than the simulator controller 11, for example, external personal computers 201 and 202 in which application software for browsing PDF files has been already installed.

The general-purpose electronic document G includes the job information, the three-dimensional images 112b, and the playback information 112c. This enables the three-dimensional images 112b to be continuously replayed by animation on the personal computers 201 and 202.

In this manner, the simulation results by the robot simulator 10 can be easily confirmed or distributed even in the environment where no robot simulator 10 is introduced. This can bring advantages that could not have been provided by the conventional technique, for example, an advantage where a person in charge of sales can carry the general-purpose electronic document G in a medium such as a USB memory to a client and perform business activities while allowing the client to confirm the general-purpose electronic document G.

The storage unit 112 is a storage device such as a hard disk drive and nonvolatile memory, and stores therein the model information 112a, the three-dimensional images 112b, and the playback information 112c. The contents of the model information 112a, the three-dimensional images 112b, and the playback information 112c have been already described, and the description thereof will be omitted.

FIG. 2 illustrates an example where the simulator controller 11 generates a virtual image of the robot 30V, etc., based on the preregistered model information 112a, but the information necessary for generating an image may be sequentially acquired from a higher-level apparatus communicably connected to the simulator controller 11.

Figure 4:
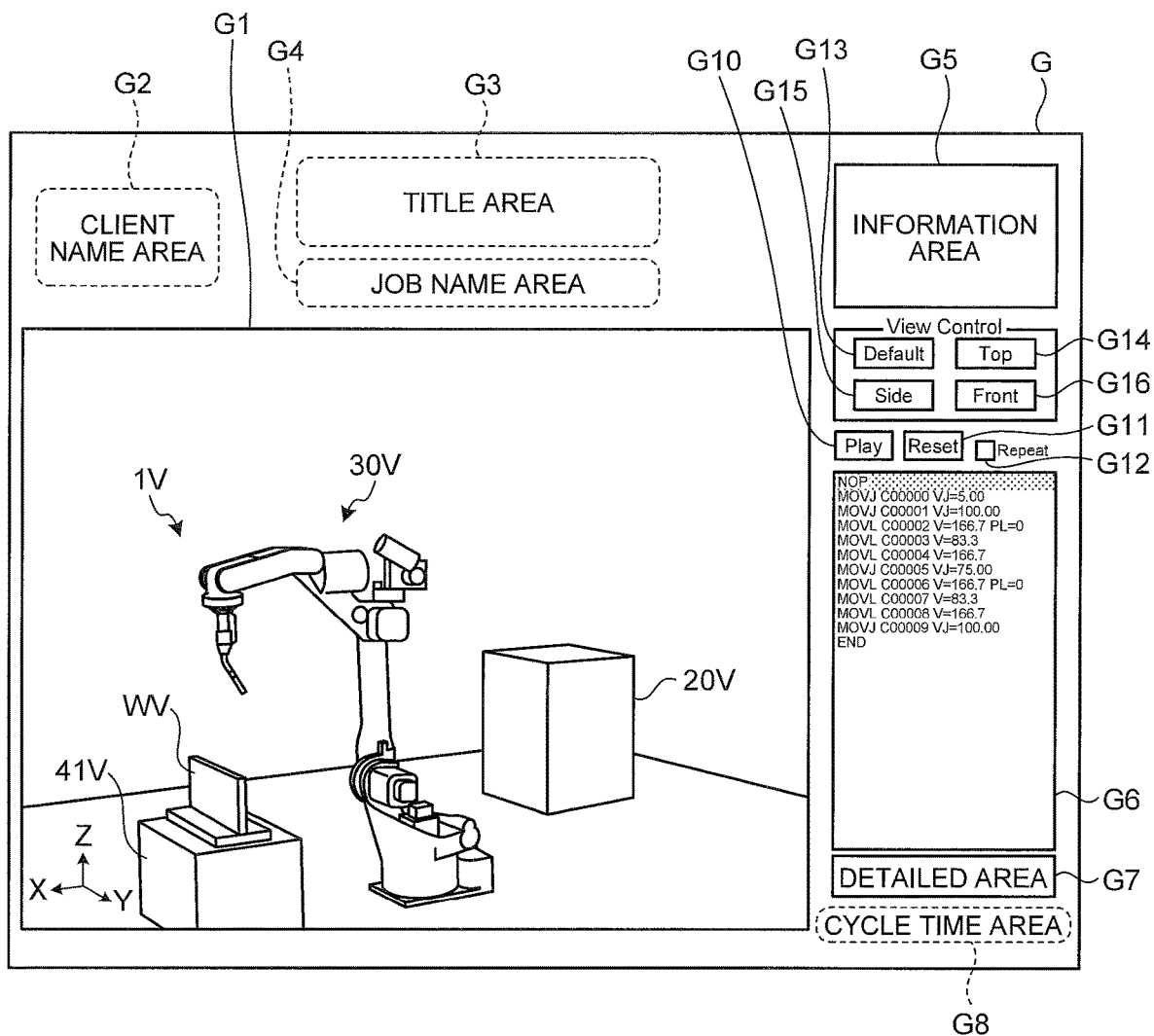
FIG. 4 is a view illustrating an example of the output layouts of a general-purpose electronic document.

The following describes a specific output layout of the general-purpose electronic document G with reference to FIG. 4. FIG. 4 is a view illustrating an example of the output layouts of the general-purpose electronic document G. FIG. 4 to FIG. 5K (except for FIG. 5H), which will be illustrated later, illustrate cases where the general-purpose electronic document G is displayed, for example, on the display unit 12 of the robot simulator 10 and display apparatuses such as displays of the personal computers 201 and 202 by the application software for browsing preliminary installed in the robot simulator 10 and the personal computers 201 and 202.

As illustrated in FIG. 4, the general-purpose electronic document G is output by the output unit 111f in an output layout where a plurality of output areas G1 to G8 and a plurality of operation components G10 to G16 are arranged, for example.

For example, the output area G1 is a "view area", and is an area where a virtual three-dimensional image of the robot system 1V including the robot 30V, a robot controller 20V, the placement base 41V, the workpiece WV, and the above-mentioned reference coordinate system (see FIG. 3) in the three-dimensional space is output.

As illustrated in FIG. 4, for example, the output area G2 is a "client name area" where a client name is output, and the output area G3 is a "title area" where a title name of the general-purpose electronic document G is output.

The output area G4 is a "job name area" where a job name confirmable in the general-purpose electronic document G is output, and the output area G5 is an "information area" where the information related to the job program and the general-purpose electronic document G is output such as a model of the robot 30V, a date when the general-purpose electronic document G is output, and a name of an operator. The information output to the output areas G2 to G5 is based on the above-mentioned additional information.

For example, the output area G6 is a "command area" where the contents of the job information, specifically the whole job steps of the job program are sorted and output in the execution order. The job steps in the "command area" can be optionally selected in the unit of rows by pointing devices such as a mouse.

For example, when a job step in the output area G6 is optionally selected, the output area G7 is a "detailed area" where detailed information of the selected job step is output.

For example, the output area G8 is a "cycle time area" where the playback time is output when the robot system 1V in the output area G1 has been replayed by animation. The playback time can be synchronized with the real operating time of the robot 30 as described above.

The operation component G10 is a "Play (&Pause)" button for switching the animation playback and stop of the robot system 1V for each click. The operation component G11 is a "Reset" button for returning the start point of the animation playback to the first job step.

The operation component G12 is a "Repeat" check box for repeatedly replaying animation of the robot system 1V for each check.

Each of the operation components G13 to G16 is a button for changing the viewpoint of the robot system 1V in the output area G1 to a predetermined direction and position. For example, the "Default" button of the operation component G13 is clicked for changing the viewpoint of the robot system 1V to a predetermined position in an oblique direction.

For example, the "Top" button of the operation component G14 is clicked for changing the same viewpoint to a plane view. For example, the "Side" button of the operation component G15 is clicked for changing the same viewpoint to what is called a side view.

For example, the "Front" button of the operation component G16 is clicked for changing the same viewpoint to what is called a front view. Specific images of changes in viewpoints will be described with reference to FIGS. 5E, 5F, and 5I to 5K.

The display unit 12 and the operation unit 13 of the robot simulator 10 are used for preliminary performing various settings such as the arrangement of the output areas G1 to G8 and the operation components G10 to G16, the definition of the output contents, and the allocation of functions.

Figure 5A:
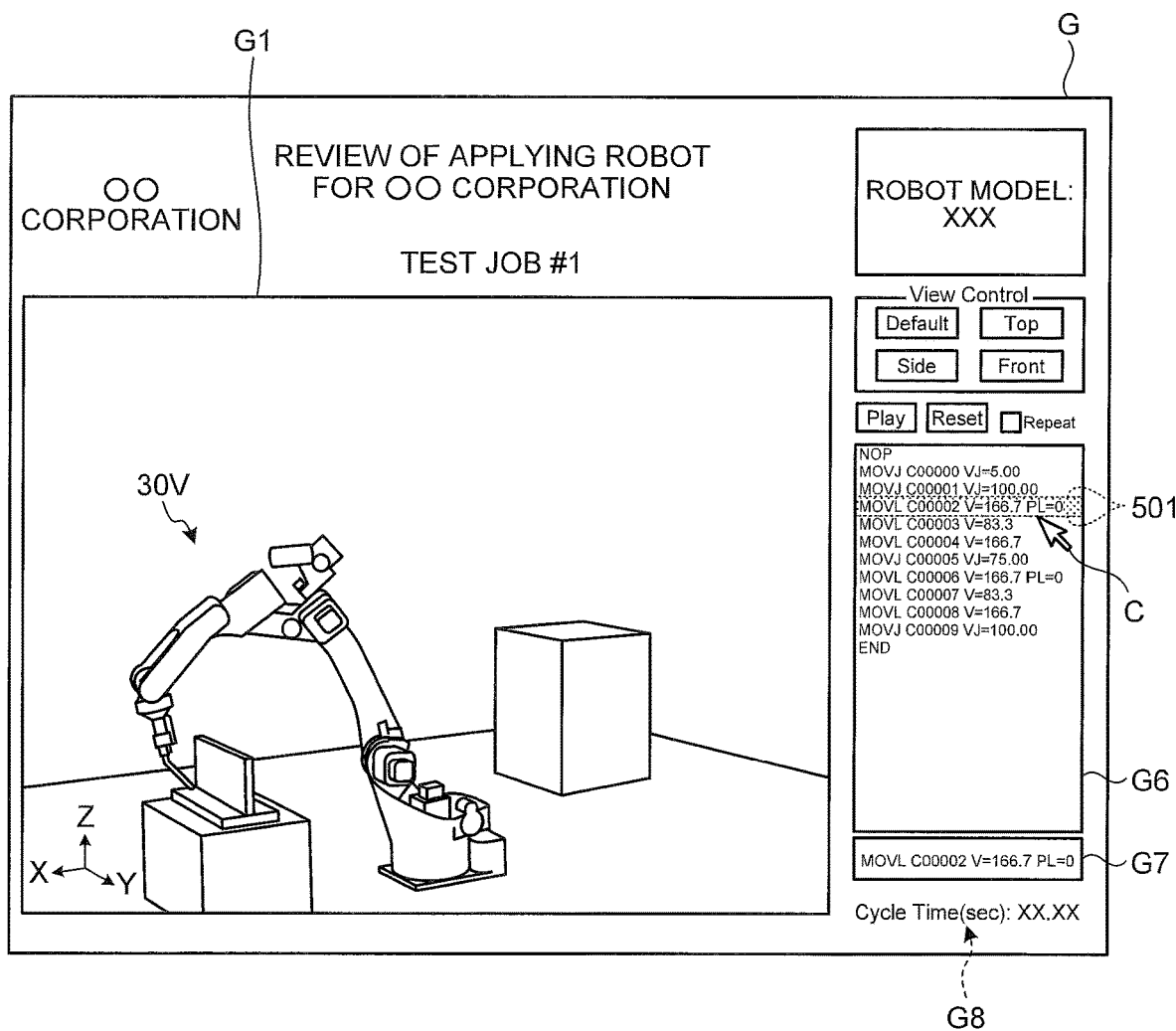
FIGS. 5A to 5G are views (No. 1 to No. 7) illustrating specific examples of the general-purpose electronic document.
Figure 5B:
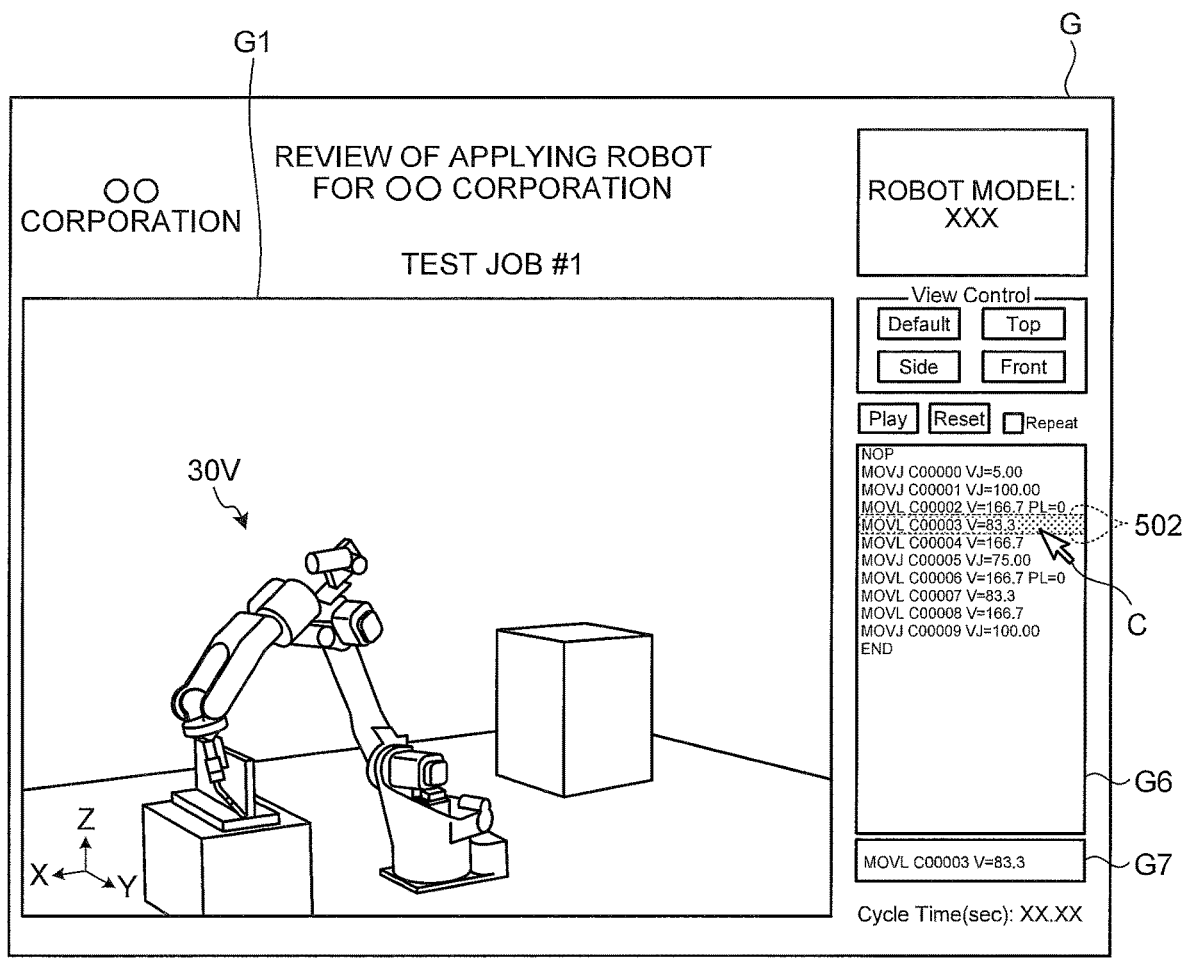
Figure 5C:
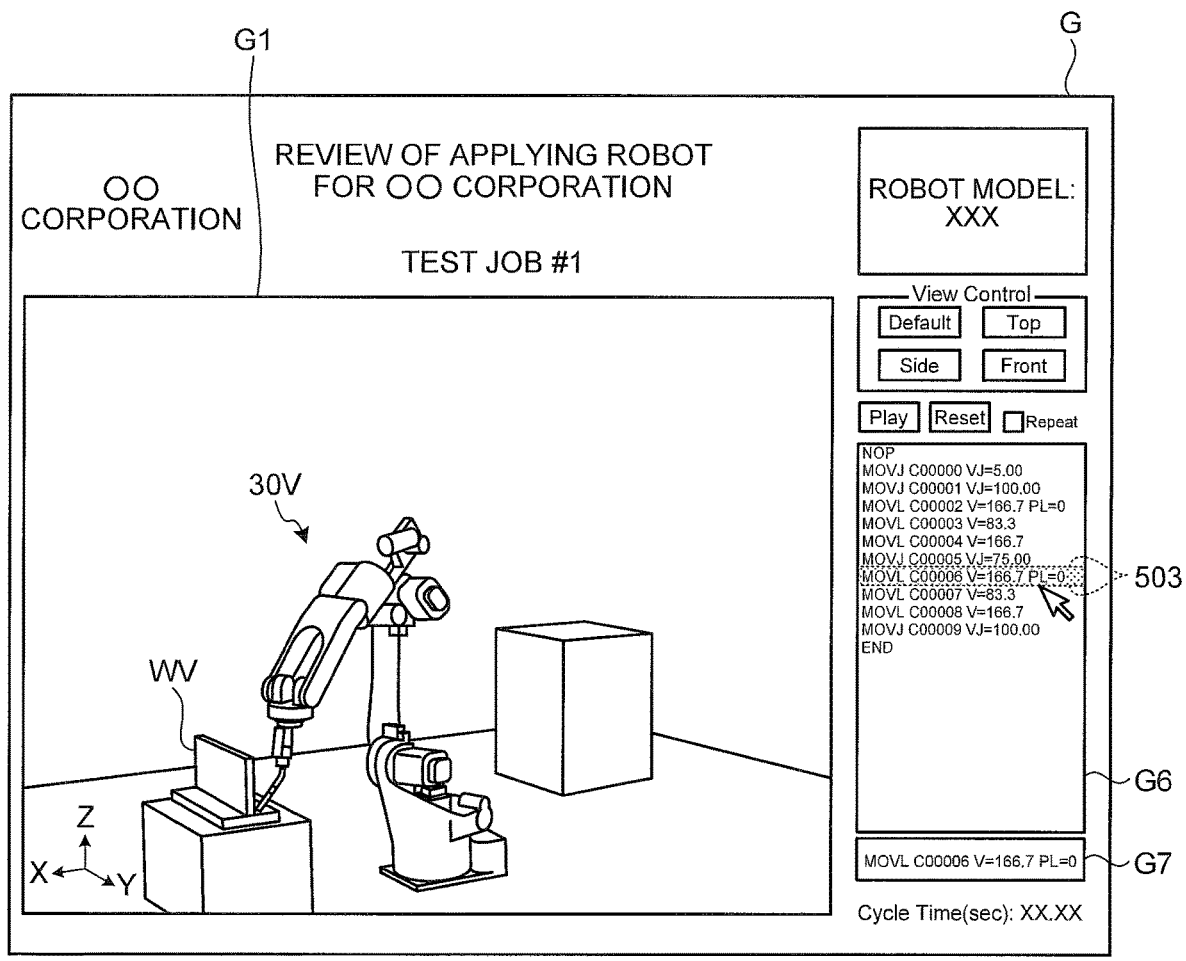
Figure 5D:
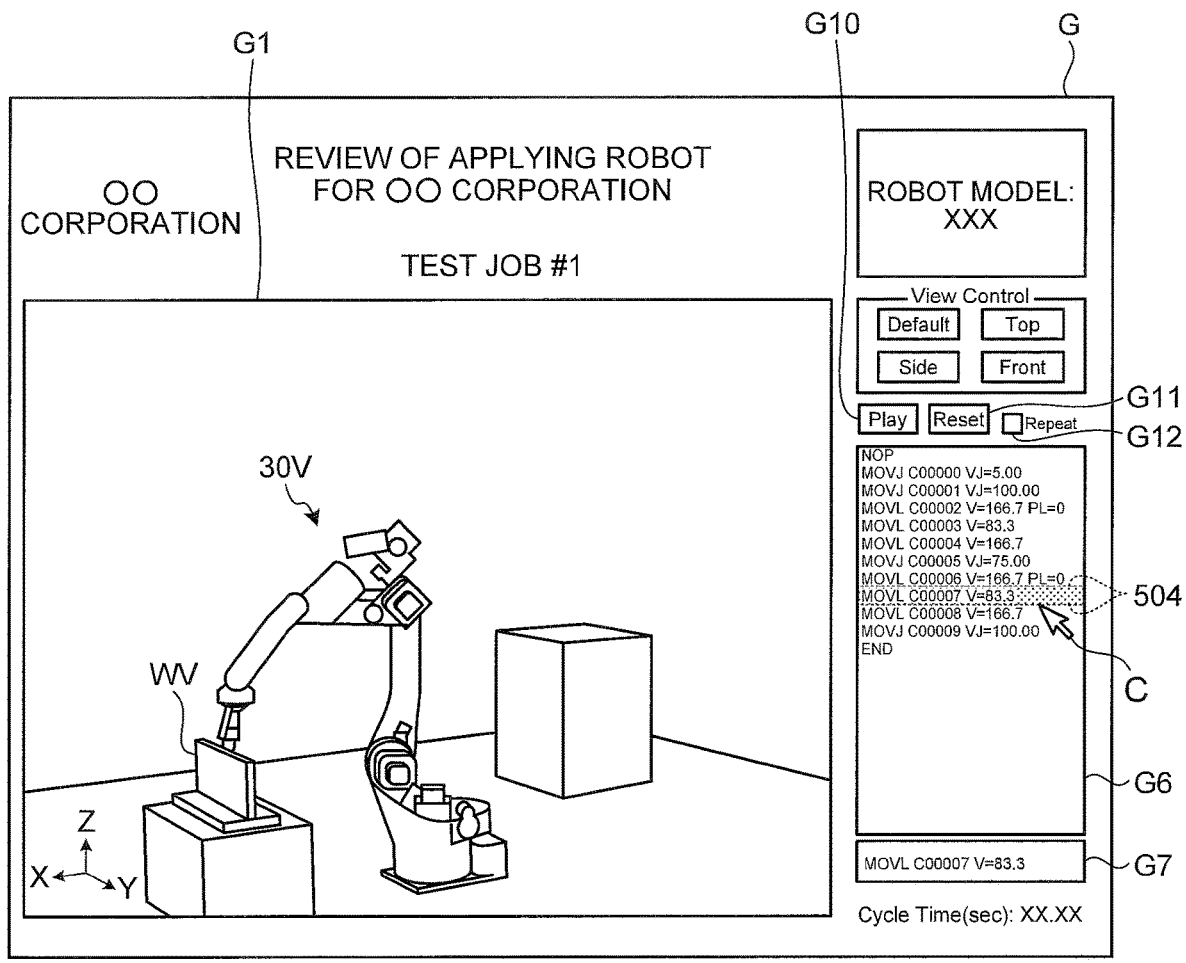
Figure 5E:
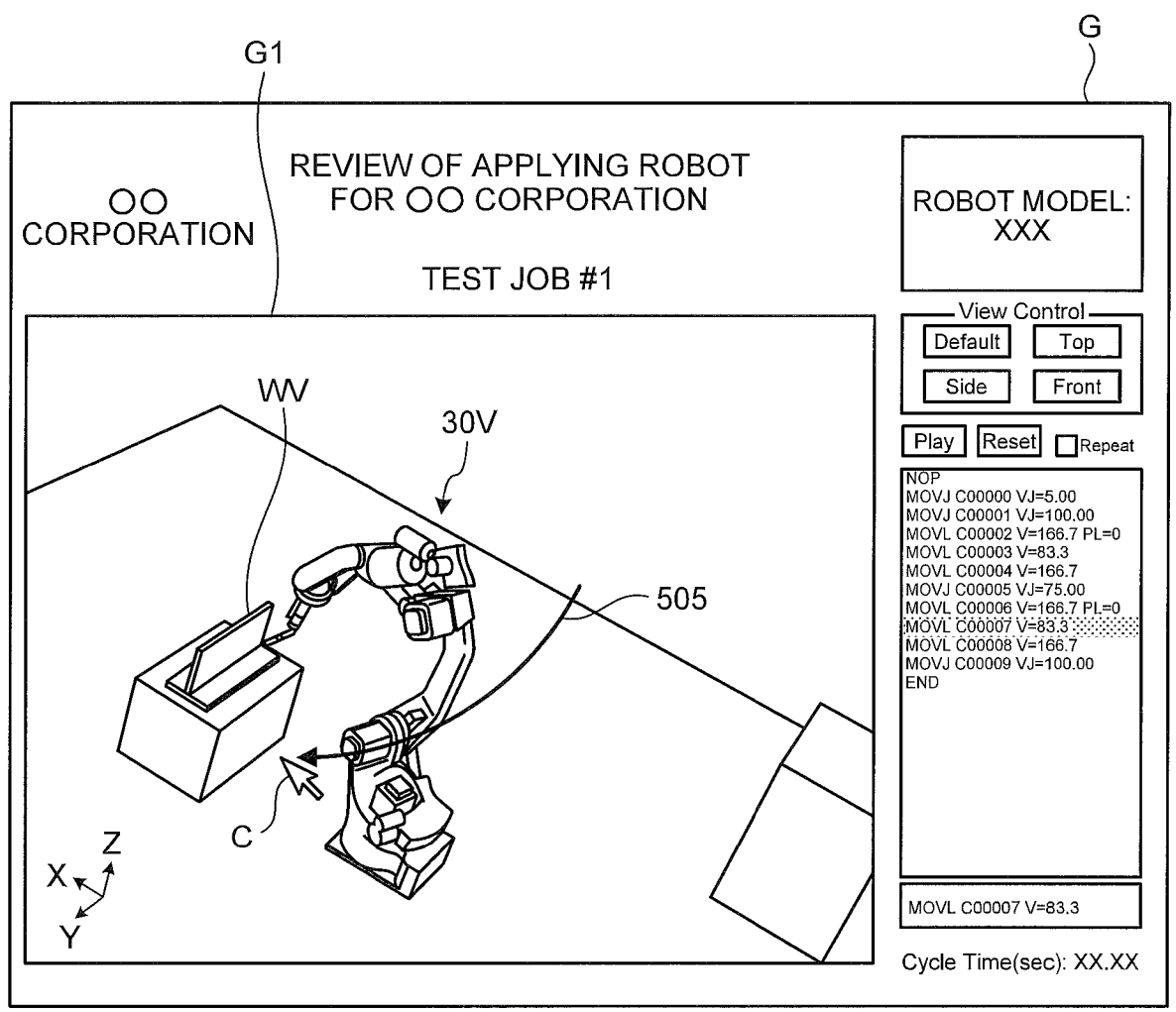
Figure 5F:
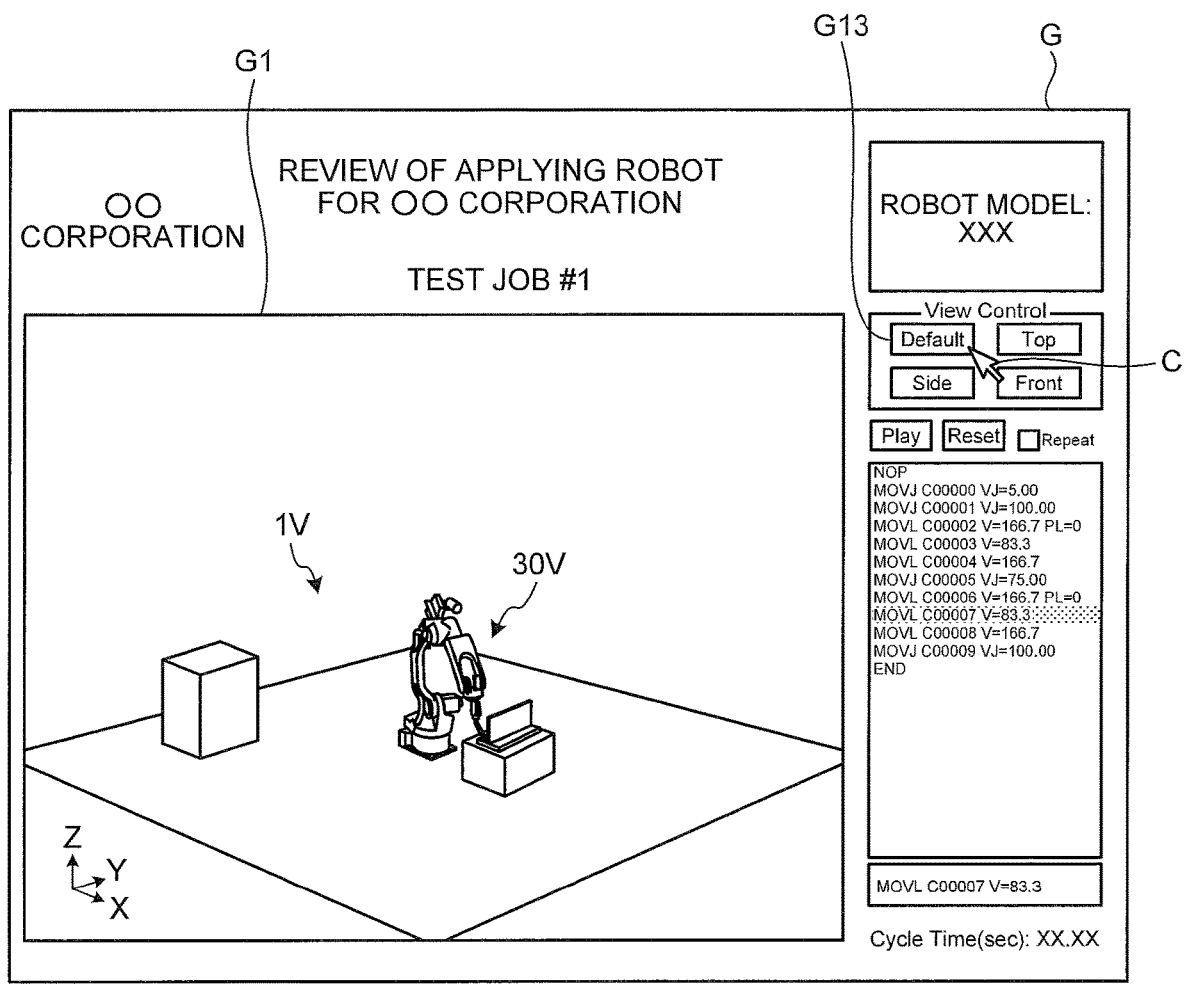
Figure 5G:
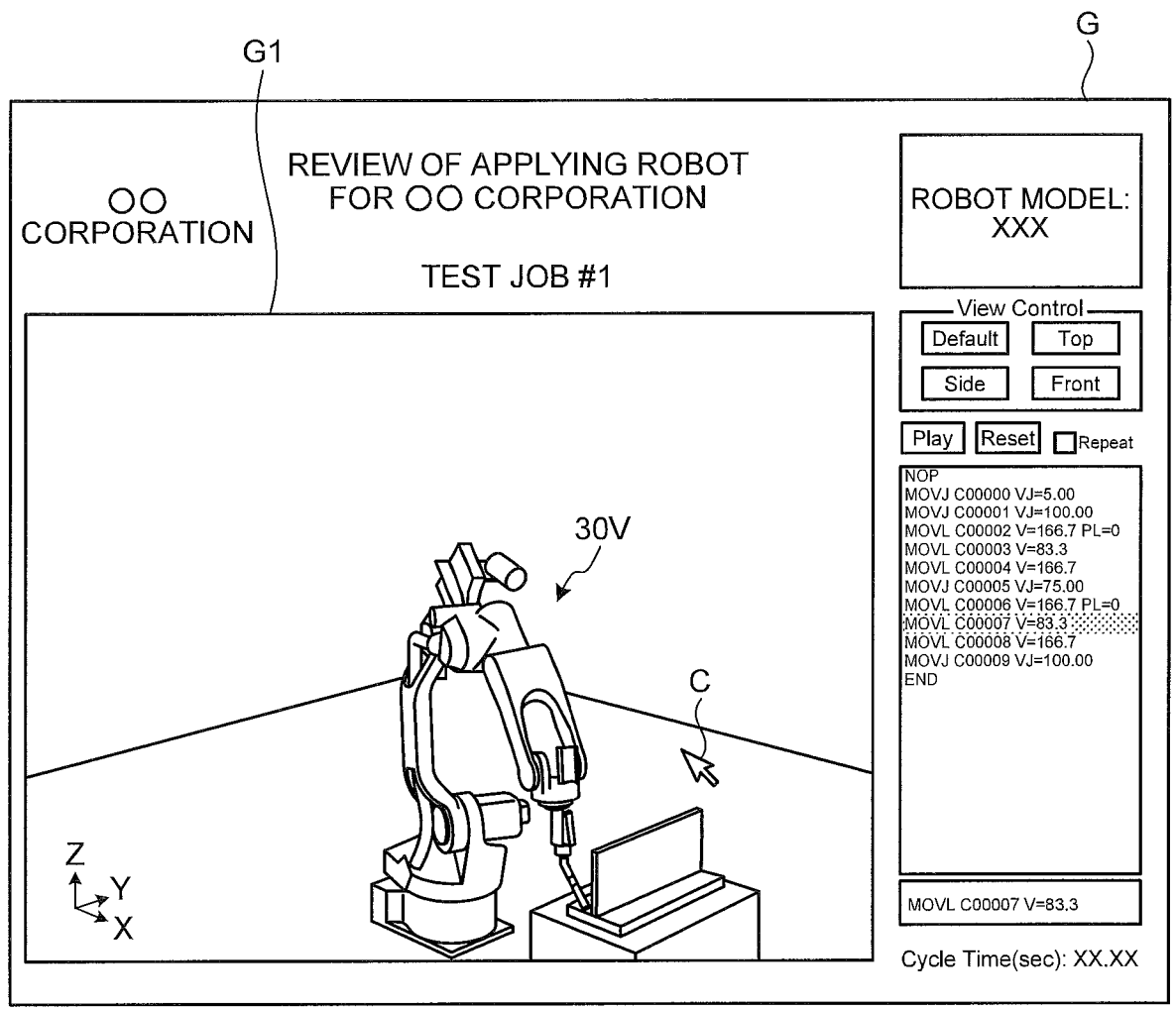
Figure 5H:
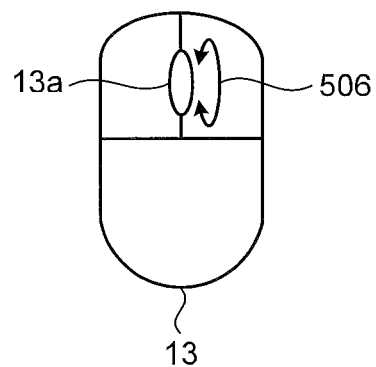
FIG. 5H is a view illustrating an example of the operation on the general-purpose electronic document.
Figure 5I:
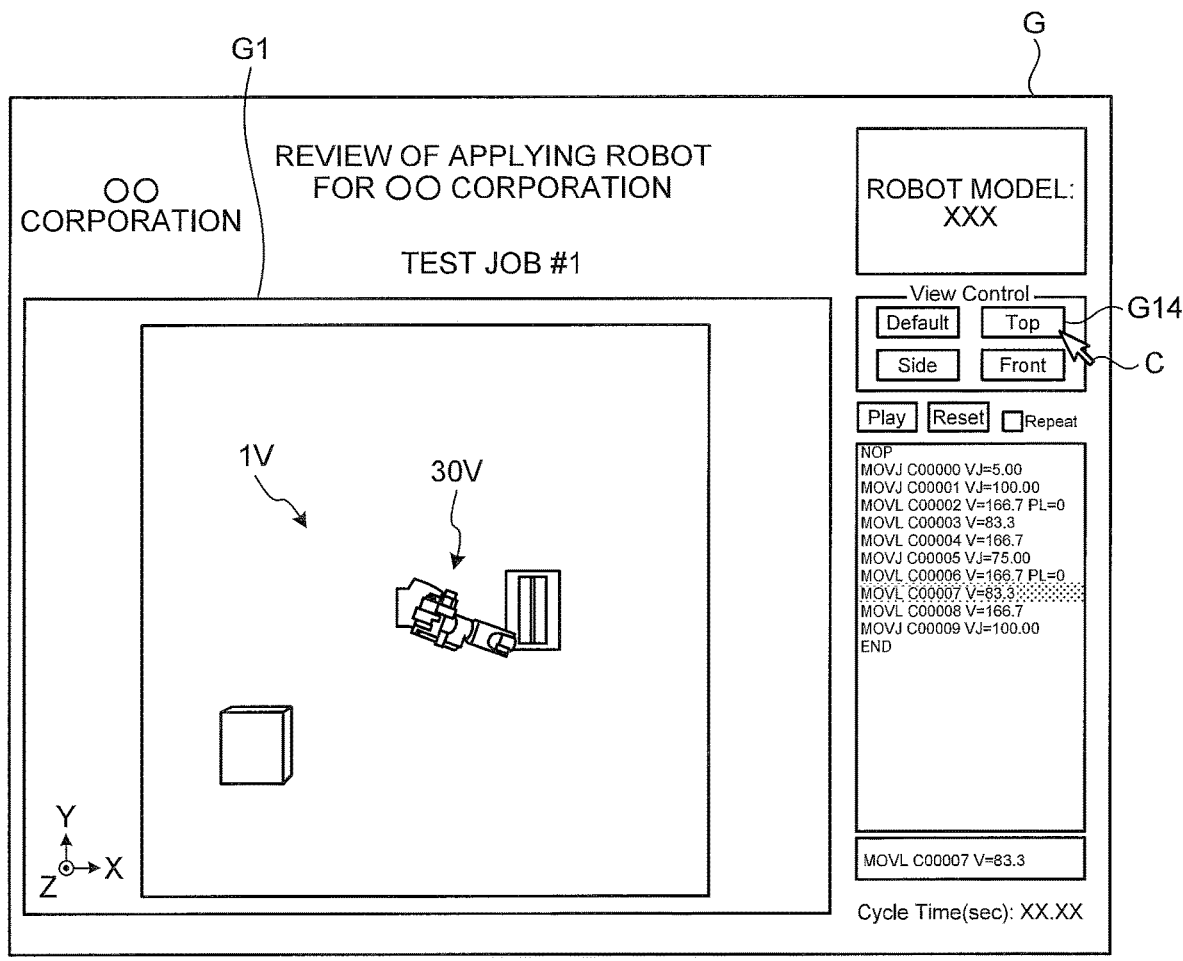
FIGS. 5I to 5K are views (No. 8 to No. 10) illustrating specific examples of the general-purpose electronic document.
Figure 5J:
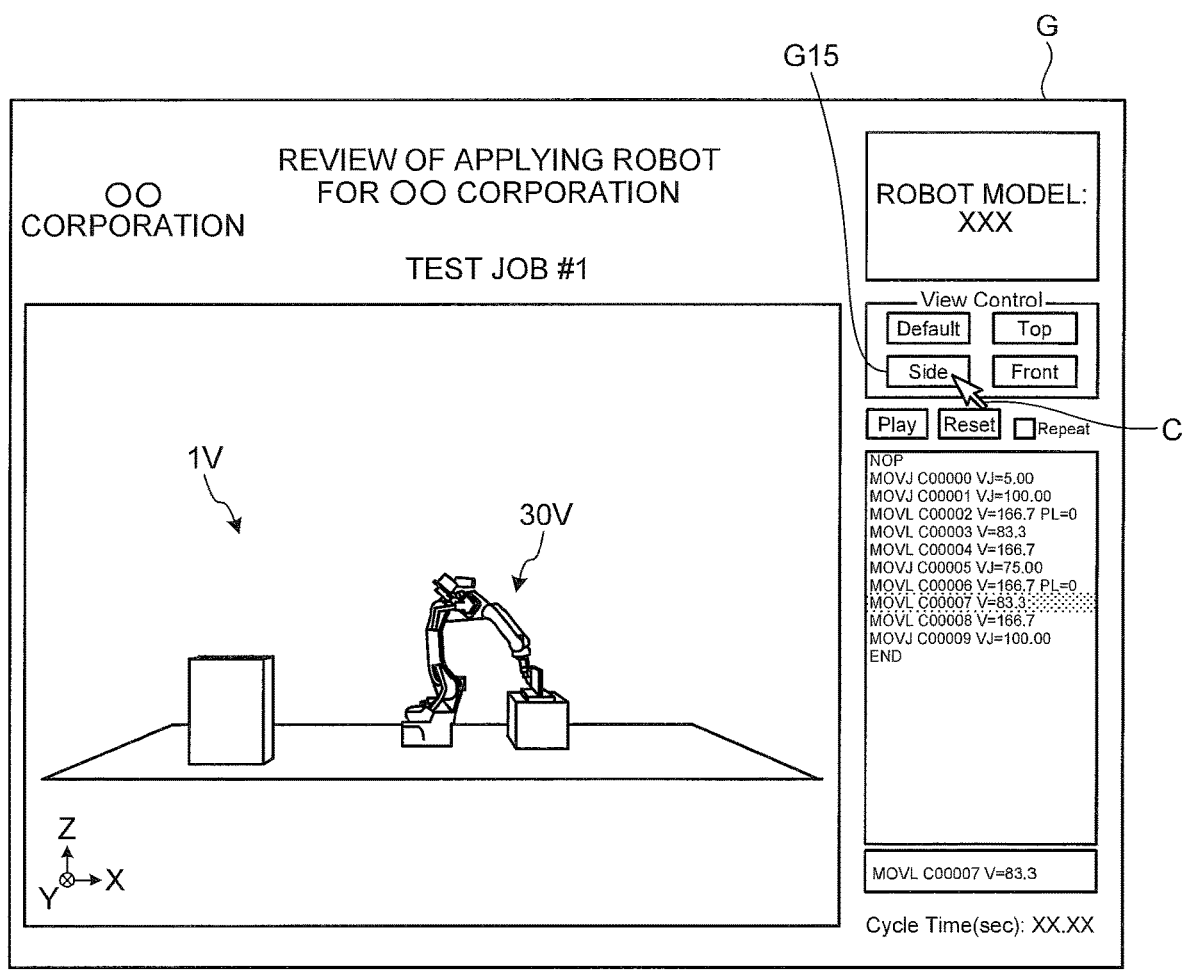
Figure 5K:
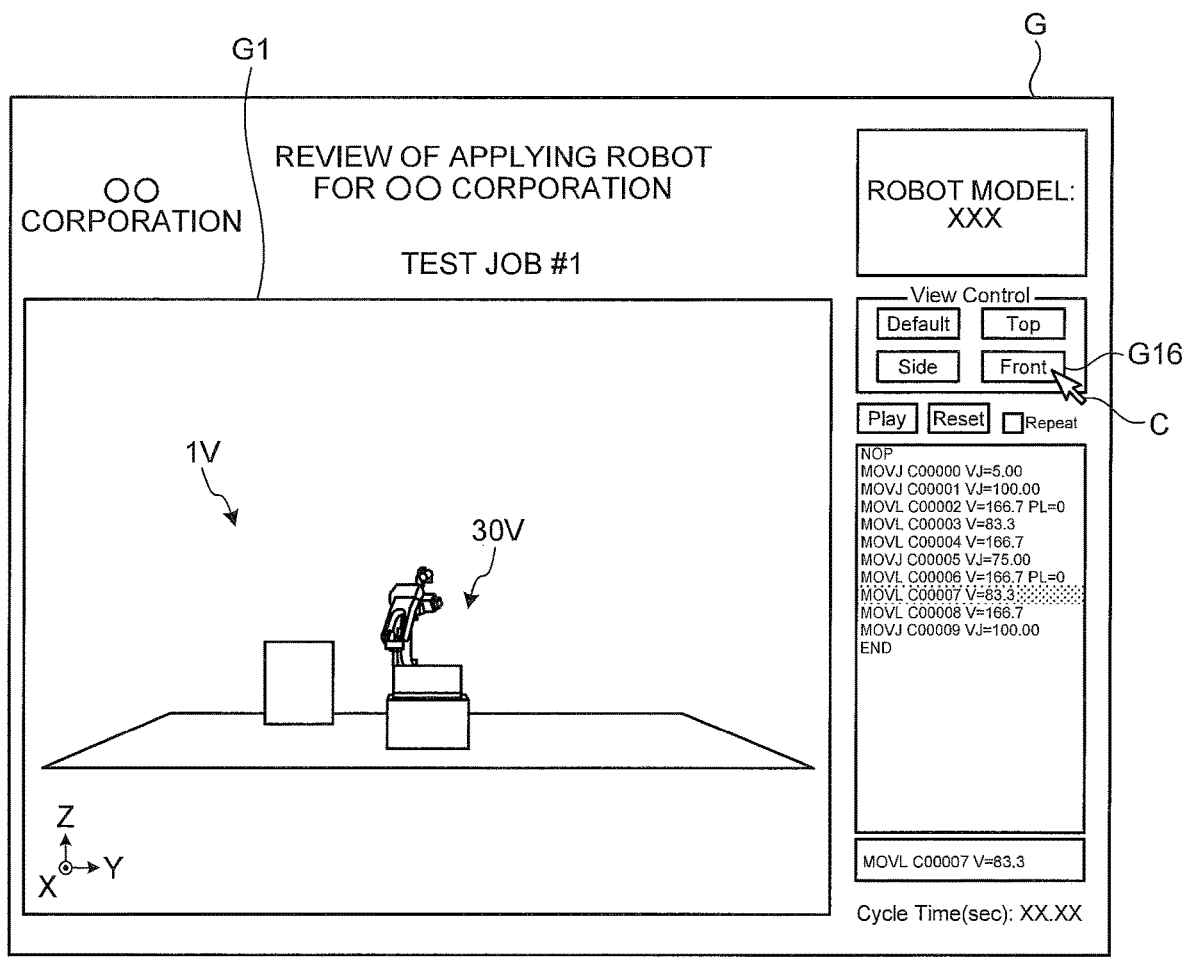

The following describes real specific examples and operation examples of the general-purpose electronic document G with reference to FIGS. 5A to 5K. FIGS. 5A to 5G and FIGS. 5I to 5K are views (No. 1) to (No. 10) illustrating specific examples of the general-purpose electronic document G. FIG. 5H is a view illustrating an example of the operation on the general-purpose electronic document G.

In FIGS. 5A to 5K (except for FIG. 5H), "oo corporation" is output to the "client name area", "Review of applying robot for oo corporation" to the "title area", and "Test job#1" to the "job name area" illustrated in FIG. 4 for the sake of convenience.

Similarly, "Robot model: XXX" is output to the "information area". Similarly, the job step optionally selected in the "command area" of the output area G6 is output as it is to the "detailed area" of the output area G7.

A cycle time is output in the form of "Cycle Time (sec): XX.XX" to the output area G8. The cycle time is updated as appropriate depending on the animation playback in the output area G1.

The posture of the robot 30V illustrated in the output area G1 in FIG. 4 may be hereinafter referred to as a "basic posture". Such a "basic posture" corresponds to an initial state posture before the job program in the output area G6 is executed.

In the general-purpose electronic document G, when a certain job step in the output area G6 is selected, the robot 30V in the output area G1 is updated in a still image so as to be in a state where the job step has been executed by the real robot 30.

In other words, the robot 30V in the output area G1 is changed to the robot 30V having taken a reached posture to the teaching point depending on the selected job step based on the playback information 112c so as to jump from a still image to a still image.

For example, when the job step surrounded by a dashed line 501 in the output area G6 is selected by a mouse cursor C, FIG. 5A illustrates a state in which the robot 30V has been updated in a still image to the reached posture where the job step has been executed.

In FIG. 5A, the job step of "MOVL C00002 V=166.7 PL=0" is selected as illustrated in the output area G7 ("detailed area"). In this embodiment, "MOVL" is an interpolation operation command including the specification of the interpolating method for the robot 30V. Specifically, "MOVL" is a command for operating the robot 30V so that the moving locus of the end effector 35 depicts a straight line. "C00002" denotes a teaching point that the robot 30V must reach. In other words, FIG. 5A illustrates a state where the robot 30V has reached the teaching point C00002. "V=166.7" specifies the operation speed at which the robot 30V moves to the teaching point C00002. "PL=0" specifies an option parameter related to the route generation when the robot 30V reaches the teaching point C00002.

When the job step surrounded by a dashed line 502 is selected by the mouse cursor C, FIG. 5B illustrates a state in which the robot 30V has been updated in a still image to the reached posture where the job step has been executed. Similarly to FIG. 5A, FIG. 5B illustrates a state where the robot 30V has reached a teaching point C00003.

When the job step surrounded by a dashed line 503 is selected by the mouse cursor C, FIG. 5C illustrates a state in which the robot 30V has been updated in a still image to the reached posture where the job step has been executed. Specifically, in FIG. 5C, the robot 30V takes the reached posture where the tip of the welding torch comes to the back side of the workpiece WV with a T-shaped cross section. FIG. 5C illustrates a state where the robot 30V has reached a teaching point C00006.

When the job step surrounded by a dashed line 504 is selected by the mouse cursor C, FIG. 5D illustrates a state in which the robot 30V has been updated in a still image to the reached posture where the job step has been executed. FIG. 5D illustrates a state where the robot 30V has reached a teaching point C00007.

When the "Play" button of the operation component G10 is clicked in a reset state triggered by pressing the "Reset" button of the operation component G11, the animation is replayed in the output area G1 where the robot 30V takes postures from the basic one in FIG. 4 to the reached ones in FIGS. 5A to 5D in order and returns to the basic posture based on the playback information 112c. In such a case, each interval between the postures in FIGS. 4, 5A, 5B, 5C, and 5D is interpolated, and animation where the robot 30V smoothly operates is replayed.

When the "Repeat" check box of the operation component G12 is checked, the animation is repeatedly played.

When the "Play" button is clicked while a certain job step in the output area G6 has been selected, the animation based on the selected job step is replayed.

Specifically, selecting the job step causes the robot 30V to be updated to the reached posture where the selected job step has been executed, and then, clicking the "Play" button causes the animation where a further job program is executed to be replayed. Such animation playback may start from, for example, the job step as its reference or may start from a teaching point just before the teaching point corresponding to the job step as its reference.

In this manner, the robot simulator 10 in accordance with the embodiment enables a series of operations of the robot 30V at the time of executing the job program to be confirmed and verified with the use of animation playback. Furthermore, the robot simulator 10 enables the position and posture of the robot 30V including the end effector 35 at the teaching point depending on the selected job step to be confirmed and verified.

FIG. 5D illustrates a state where the tip of the welding torch in the robot 30V is hidden on the back side of the workpiece WV.

In such a case, for example, as illustrated in FIG. 5E, the viewpoint position in the output area G1 can be optionally rotated and changed in the general-purpose electronic document G by dragging the mouse cursor C in an arc shape on the output area G1 while pressing the mouse button (see an arrow 505 in FIG. 5E).

In this manner, in the general-purpose electronic document G, the part hidden from a certain viewpoint can be exposed and can be easily confirmed by a viewer.

As described above, the operation components G13 to G16 are used for changing the viewpoint in the output area G1 to a predetermined direction and position.

Specifically, as illustrated in FIG. 5F, when the "Default" button of the operation component G13 is clicked with the mouse cursor C, the viewpoint of the robot system 1V in the output area G1 is based on the intermediate direction between the X-axis positive direction and the Y-axis negative direction in the reference coordinate system in FIG. 5F and on a predetermined position.

When a distance from such a predetermined position is not appropriate and hard to confirm, a predetermined operation associated on the output area G1 is performed so as to change the scale in the general-purpose electronic document G.

For example, FIG. 5G illustrates a state where the robot 30V is enlarged in the output area G1 by changing the scale from a predetermined position in FIG. 5F. The scale can be changed by, for example, placing the mouse cursor C on the output area G1 and then rotating a mouse wheel 13a of the mouse serving as the operation unit 13 for a certain amount as illustrated in FIG. 5H (see an arrow 506 in FIG. 5H).

Even if the distance from a certain viewpoint position is not appropriate and hard to confirm, the scale change can optimize the distance and enable a viewer to easily confirm the distance in the general-purpose electronic document G.

Referring back to the viewpoint change, the following describes a case where the "Top" button of the operation component G14 is operated. As illustrated in FIG. 5I, when the "Top" button of the operation component G14 is clicked with the mouse cursor C, the viewpoint of the robot system 1V in the output area G1 is based on a predetermined position in the Z-axis positive direction in FIG. 5I.

As illustrated in FIG. 5J, when the "Side" button of the operation component G15 is clicked with the mouse cursor C, the same viewpoint is based on a predetermined position in the Y-axis negative direction in FIG. 5J. As illustrated in FIG. 5K, when the "Front" button of the operation component G16 is clicked with the mouse cursor C, the same viewpoint is based on a predetermined position in the X-axis positive direction in FIG. 5K.

The following describes a process for the processing executed by the robot simulator 10. FIG. 6 is a flowchart illustrating the process for the processing executed by the robot simulator 10. In the explanation with reference to FIG. 6, the job information corresponding to the simulation results has been generated by the job generating unit 111b and has been registered on the job information DB 14.

As illustrated in FIG. 6, the job information acquiring unit 111c acquires job information from the job information DB 14 (Step S101).

The image generating unit 111d generates the three-dimensional images 112b of the robot system 1 for each operation command included in the job information (Step S102).

Subsequently, the playback information generating unit 111e generates the playback information 112c for replaying the three-dimensional images 112b by animation in association with the job information (Step S103).

The output unit 111f generates and outputs the output file "general-purpose electronic document G" where the job information, the three-dimensional images 112b, and the playback information 112c are embedded in a general-purpose electronic document format (Step S104) and then ends the processing.

As described above, the robot simulator in accordance with the embodiment includes the job information acquiring unit, the image generating unit, the playback information generating unit, and the output unit.

The job information acquiring unit acquires job information that is a group of operation commands to a robot and that is information including a plurality of target points through which the robot must pass. The image generating unit generates a virtual three-dimensional image of the robot system including the robot in the three-dimensional space for each operation command.

The playback information generating unit generates playback information that is information for continuously replaying the above-mentioned three-dimensional images by animation in association with the above-mentioned job information. The output unit generates and outputs an output file where the above-mentioned job information, the above-mentioned three-dimensional image, and the above-mentioned playback information are embedded in an electronic document format that can be browsed in a general-purpose manner.

In this manner, the robot simulator in accordance with the embodiment enables the simulation results to be easily confirmed and distributed.

The above-mentioned embodiment has described a robot simulator that can acquire the simulation results as the job information and output this job information in a general-purpose electronic document format in association with a virtual three-dimensional image of the robot system in the three-dimensional space as an example.

Such a robot simulator can be formed as a teaching system if the robot simulator has a function of generating the job information. The robot simulator in accordance with the above-mentioned embodiment includes the job generating unit, and can be converted into a teaching system.

The above-mentioned embodiment has described a case where one simulator controller has functions of generating the job program and outputting the general-purpose electronic document as an example, but simulator controllers may be separately formed for these functions.

The above-mentioned embodiment has described an example of the output layouts for the general-purpose electronic document with reference to FIG. 4, but this is just an example and can be changed as appropriate depending on the use of the general-purpose electronic document, requests from clients, and the like. For example, detailed information related to the end effector, which is not illustrated in FIG. 4, may be output.

Specifically, it is preferable, for example, that a new output area, which can be said as an optionally editable "free area", be provided so as to output information such as information related to the weight of the end effector, dynamic information related to the position of the tip required to reach the teaching point, and information related to each axis included in the end effector to the "free area".

In addition, the items output to each area may be changed as appropriate. For example, "my company name" can be output to the "client name area".

The above-mentioned embodiment has described a case where the robot is a welding robot that applies welding to a workpiece as an example, but this does not limit the use of the robot.

The above-mentioned embodiment has described an example where the robot is a six-axis single-arm robot, but this does not limit the number of axes or arms of the robot.

The above-mentioned embodiment has described a case where a mouse is mainly used for operation as an example, but this is not limiting. For example, the general-purpose electronic document may be displayed on what is called a multi-touch compatible touch panel so as to receive the multi-touch operation of a viewer on the touch panel. The same applies to the display unit and the operation unit of the robot simulator itself.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A robot simulator comprising
a processor apparatus configured to:
   acquire job information that includes a group of operation commands for operating a robot and information for a plurality of target points through which the robot passes;
   generate virtual three-dimensional images of a robot system including the robot in a three-dimensional space for each of the operation commands;
   generate playback information for continuously replaying the three-dimensional images by animation in association with the job information;
   cause a display unit to display an operation component for outputting an output file;
   output the output file, based on an interaction with the operation component, in which the job information including the operation commands for operating the robot, the three-dimensional images, and the playback information are embedded in an electronic document format that is browsable in a general-purpose manner;
   generate, when the output file is displayed on a display apparatus other than the display unit, the output file in an output layout in which a content of the job information including the operation commands of a job program for operating the robot is simultaneously displayed along with the three-dimensional images on the display apparatus, the three-dimensional images of the output file being playable by animation;
   generate, when the output file is displayed on the display apparatus, the output file so that the content of the job information is selectable for each operation command for operating the robot among the operation commands for operating the robot; and
   generate, when the operation command for operating the robot is selected, the output file in the electronic document format so that the three-dimensional images are updated to a state in which the selected operation command for operating the robot is conducted by a robot created by the three-dimensional images.

2. The robot simulator according to claim 1, wherein the processor apparatus is configured to generate, when the operation command for operating the robot is selected, the output file so that the three-dimensional images are updated to the state in which the selected operation command for operating the robot is conducted and the three-dimensional images after the operation command for operating the robot are replayed by animation on the basis of the playback information.

3. The robot simulator according to claim 1, wherein the processor apparatus is configured to generate, if a predetermined operation corresponding to a viewpoint change in the three-dimensional space is received when the output file is displayed on the display apparatus, the output file so as to perform the viewpoint change based on the predetermined operation.

4. The robot simulator according to claim 2, wherein the processor apparatus is configured to generate, if a predetermined operation corresponding to a viewpoint change in the three-dimensional space is received when the output file is displayed on the display apparatus, the output file so as to perform the viewpoint change based on the predetermined operation.

5. The robot simulator according to claim 3, wherein the processor apparatus is configured to generate the output file in the output layout such that operation components capable of receiving the viewpoint change in the three-dimensional space are arranged.

6. The robot simulator according to claim 4, wherein the processor apparatus is configured to generate the output file in the output layout such that operation components capable of receiving the viewpoint change in the three-dimensional space are arranged.

7. The robot simulator according to claim 1, wherein the processor apparatus is configured to generate, if a predetermined operation corresponding to a scale change in the three-dimensional space is received when the output file is displayed on the display apparatus, the output file so as to perform the scale change based on the predetermined operation.

8. The robot simulator according to claim 1, wherein the output file is a portable document format (PDF) file.

9. The robot simulator according to claim 8, wherein the output file includes information related to the three-dimensional images as a part of the PDF file.

10. A file generation method for a robot simulator, the method comprising:
   acquiring job information that includes a group of operation commands for operating a robot and information for a plurality of target points through which the robot passes;
   generating virtual three-dimensional images of a robot system including the robot in a three-dimensional space for each of the operation commands;
   generating playback information for continuously replaying the three-dimensional images by animation in association with the job information;
   causing a display unit to display an operation component for outputting an output file;
   generating the output file, based on an interaction with the operation component, in which the job information including the operation commands for operating the robot, the three-dimensional images, and the playback information are embedded in an electronic document format that is browsable in a general-purpose manner;
   generating, when the output file is displayed on a display apparatus other than the display unit, the output file in an output layout in which a content of the job information including the operation commands of a job program for operating the robot is simultaneously displayed along with the three-dimensional images on the display apparatus, the three-dimensional images of the output file being playable by animation;

generating, when the output file is displayed on the display apparatus, the output file so that the content of the job information is selectable for each operation command for operating the robot among the operation commands for operating the robot; and generating, when the operation command for operating the robot is selected, the output file in the electronic document format so that the three-dimensional images are updated to a state in which the selected operation command for operating the robot is conducted by a robot created by the three-dimensional images.

11. A robot simulator comprising:

means for acquiring job information that includes a group of operation commands for operating a robot and information for a plurality of target points through which the robot passes;

means for generating virtual three-dimensional images of a robot system including the robot in a three-dimensional space for each of the operation commands;

means for generating playback information for continuously replaying the three-dimensional images by animation in association with the job information;

means for causing a display unit to display an operation component for outputting an output file;

means for generating and outputting the output file, based on an interaction with the operation component, in which the job information including the operation commands for operating the robot, the three-dimensional image, and the playback information are embedded in an electronic document format that is browsable in a general-purpose manner;

means for generating, when the output file is displayed on a display apparatus other than the display unit, the output file in an output layout in which a content of the job information including the operation commands of a job program for operating the robot is simultaneously displayed along with the three-dimensional images on the display apparatus, the three-dimensional images of the output file being playable by animation;

means for generating, when the output file is displayed on the display apparatus, the output file so that the content of the job information is selectable for each operation command for operating the robot among the operation commands for operating the robot; and means for generating, when the operation command for operating the robot is selected, the output file in the electronic document format so that the three-dimensional images are updated to a state in which the selected operation command for operating the robot is conducted by a robot created by the three-dimensional images.

12. The robot simulator according to claim 1, wherein the processor apparatus is configured to output the output file to an external computer comprising the display apparatus.

13. The file generation method according to claim 10, wherein
the output file is displayed by an external computer which receives the output file.

14. The robot simulator according to claim 1, wherein the processor apparatus is configured to generate the output file such that, when a predetermined operation corresponding to a viewpoint change in the three-dimensional space is received while the output file is displayed on the display apparatus, the processor apparatus changes the viewpoint of the three-dimensional images in the display of the output file.

15. The file generation method according to claim 10, further comprising generating the output file such that, when a predetermined operation corresponding to a viewpoint change in the three-dimensional space is received while the output file is displayed on the display apparatus, the viewpoint of the three-dimensional images in the display of the output file is changed.

16. The robot simulator according to claim 11, further comprising means for generating the output file such that, when a predetermined operation corresponding to a viewpoint change in the three-dimensional space is received while the output file is displayed on the display apparatus, the viewpoint of the three-dimensional images in the display of the output file is changed.

* * * * *